(12) United States Patent
Cha et al.

(10) Patent No.: US 11,436,861 B2
(45) Date of Patent: Sep. 6, 2022

(54) DISPLAY DEVICE

(71) Applicant: Samsung Display Co., Ltd., Yongin-si (KR)

(72) Inventors: Goeun Cha, Suwon-si (KR); Keumdong Jung, Seoul (KR); Yuna Kim, Seoul (KR); Kyungtea Park, Seoul (KR); Soojung Lee, Suwon-si (KR); Kangbin Jo, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/199,324

(22) Filed: Mar. 11, 2021

(65) Prior Publication Data

US 2022/0019760 A1 Jan. 20, 2022

(30) Foreign Application Priority Data

Jul. 20, 2020 (KR) ........................ 10-2020-0089881

(51) Int. Cl.
*G06K 9/00* (2022.01)
*G06F 3/147* (2006.01)
*H01L 27/32* (2006.01)
*G06V 40/12* (2022.01)
*G06V 40/13* (2022.01)

(52) U.S. Cl.
CPC .......... *G06V 40/1365* (2022.01); *G06F 3/147* (2013.01); *G06V 40/1318* (2022.01); *H01L 27/3234* (2013.01); *H01L 27/3244* (2013.01)

(58) Field of Classification Search
CPC .......... G06V 40/1365; G06V 40/1318; G06F 3/147; H01L 27/3234; H01L 27/3244
See application file for complete search history.

(56) References Cited

U.S. PATENT DOCUMENTS

| | | | |
|---|---|---|---|
| 8,638,030 B2 | 1/2014 | Lee et al. | |
| 10,733,409 B2 | 8/2020 | D'Souza et al. | |
| 2012/0326131 A1 | 12/2012 | Han | |
| 2013/0264870 A1* | 10/2013 | Keysar | H02J 1/00 307/24 |
| 2014/0192007 A1* | 7/2014 | Westhues | G06F 3/047 345/174 |
| 2016/0204168 A1 | 7/2016 | Wang et al. | |
| 2016/0283012 A1* | 9/2016 | Long | G06F 3/0412 |
| 2020/0110469 A1* | 4/2020 | Li | G06F 3/0416 |
| 2020/0110482 A1* | 4/2020 | Vu | G06F 3/0393 |
| 2020/0124892 A1* | 4/2020 | Hanshew | H01L 31/042 |
| 2020/0302255 A1* | 9/2020 | Amin | G06K 19/0709 |

FOREIGN PATENT DOCUMENTS

| | | |
|---|---|---|
| KR | 10-2011-0026866 | 3/2011 |
| KR | 10-2017-0085180 | 7/2017 |
| KR | 10-2018-0136386 | 12/2018 |
| KR | 10-2019-0068534 | 6/2019 |
| KR | 10-2020-0025078 | 3/2020 |

* cited by examiner

*Primary Examiner* — Lixi C Simpson
(74) *Attorney, Agent, or Firm* — H.C. Park & Associates, PLC

(57) ABSTRACT

A display device includes: a display panel to display an image by generating light, a sensor disposed under the display panel to convert a light energy into an electrical energy, a voltage generator connected to the sensor, and a capacitive element connected to the sensor. The electrical energy generated by the sensor is charged in the capacitive element. The sensor senses an object using the light reflected by the object.

18 Claims, 14 Drawing Sheets

DISPLAY DEVICE

CROSS-REFERENCE TO RELATED APPLICATION

This application claims priority from and the benefit of Korean Patent Application No. 10-2020-0089881, filed on Jul. 20, 2020, which is hereby incorporated by reference for all purposes as if fully set forth herein.

BACKGROUND

Field

Exemplary implementations of the invention relate generally to a display device, and, more particularly, to a display device including a fingerprint sensor which is capable of being used as a solar cell.

Discussion of the Background

Recently, a display device may include a display panel to display an image and a fingerprint sensor to sense a user's fingerprint.

Various methods, such as a capacitive overlay method that detects a variation in capacitance between electrodes, an optical method that detects an incident light using an optical sensor, an ultrasonic method that detects vibration using a piezoelectric material, or the like, are being used as fingerprint sensing methods. Fingerprint sensors may be disposed under the display panel.

Specifically, the fingerprint sensors operated in the optical method sense the light reflected by the fingerprint to detect the user's fingerprint when light generated by the display panel is provided to the user's fingerprint.

The above information disclosed in this Background section is only for understanding of the background of the inventive concepts, and, therefore, it may contain information that does not constitute prior art.

SUMMARY

Display devices including a fingerprint sensor and a capacitive element constructed according to the principles and exemplary implementations of the invention are capable of using the fingerprint sensor as a solar cell to charge the capacitive element and capable of using the charged capacitive element as an auxiliary battery. For example, when the display device is not operated in a fingerprint authentication mode, the electrical energy generated by the fingerprint sensor is charged in the capacitive element, and thus, the capacitive element serves as the auxiliary battery that supplies power to a voltage generator of the display device. Therefore, the fingerprint sensor is used in a more efficient way.

Additional features of the inventive concepts will be set forth in the description which follows, and in part will be apparent from the description, or may be learned by practice of the inventive concepts.

According to one aspect of the invention, a display device includes: a display panel to display an image by generating light, a sensor disposed under the display panel to convert a light energy into an electrical energy, a voltage generator connected to the sensor, and a capacitive element connected to the sensor. The electrical energy generated by the sensor is charged in the capacitive element. The sensor senses an object using the light reflected by the object.

The capacitive element may include a capacitor.

The capacitor may have a capacitance from about several hundred farads (F) to about several thousand farads (F).

The sensor may include a fingerprint sensor having at least one photo sensor that converts the light energy into the electrical energy, and the object may include a fingerprint.

The fingerprint sensor may be connected to the capacitive element via the voltage generator.

The display device may further include a fingerprint sensing controller connected to the fingerprint sensor to receive a fingerprint sensed by the fingerprint sensor when the fingerprint is provided to the display panel, and to output fingerprint information obtained by processing the sensed fingerprint.

The display device may further include: a first switch connected to the fingerprint sensor and the voltage generator; a second switch connected to the fingerprint sensor and the fingerprint sensing controller; and a control module to control the first switch and the second switch.

The control module may be configured to turn on the first switch and turn off the second switch when the fingerprint is not provided to the display panel.

The fingerprint sensor may be configured to receive an internal light generated by the display panel and an external light and to convert the external light and the internal light to the electrical energy, and the electrical energy is charged into the capacitive element through the voltage generator.

The control module may be configured to turn on the second switch and turn off the first switch when the fingerprint is provided to the display panel.

The display device may further include an input sensing unit disposed on the display panel, wherein the input sensing unit is configured to provide touch information of the fingerprint to the control module when the fingerprint is provided to the display panel.

The voltage generator may be configured to receive the electrical energy from the capacitive element.

The display device may further include an adhesive layer disposed between the display panel and the fingerprint sensor.

A sum of a thickness of the adhesive layer and a thickness of the fingerprint sensor may be equal to or less than about 0.1 mm.

According to another aspect of the invention, a display device includes: a display panel, a fingerprint sensor disposed under the display panel, a first switch, a voltage generator connected to the fingerprint sensor via the first switch, a capacitive element connected to the voltage generator, a second switch, a fingerprint sensing controller connected to the fingerprint sensor via the second switch, and a control module to control a switching operation of the first switch and the second switch.

The control module may be configured to turn on the first switch and turn off the second switch when a fingerprint is not provided to the display panel.

A light provided to the fingerprint sensor may be converted into an electrical energy by the fingerprint sensor, and the electrical energy may be provided to the capacitive element via the turned-on first switch and the voltage generator.

The control module may be configured to turn on the second switch and turn off the first switch when the fingerprint is provided to the display panel.

The fingerprint sensor may be configured to sense the fingerprint, and the sensed fingerprint is provided to the fingerprint sensing controller via the turned-on second switch.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
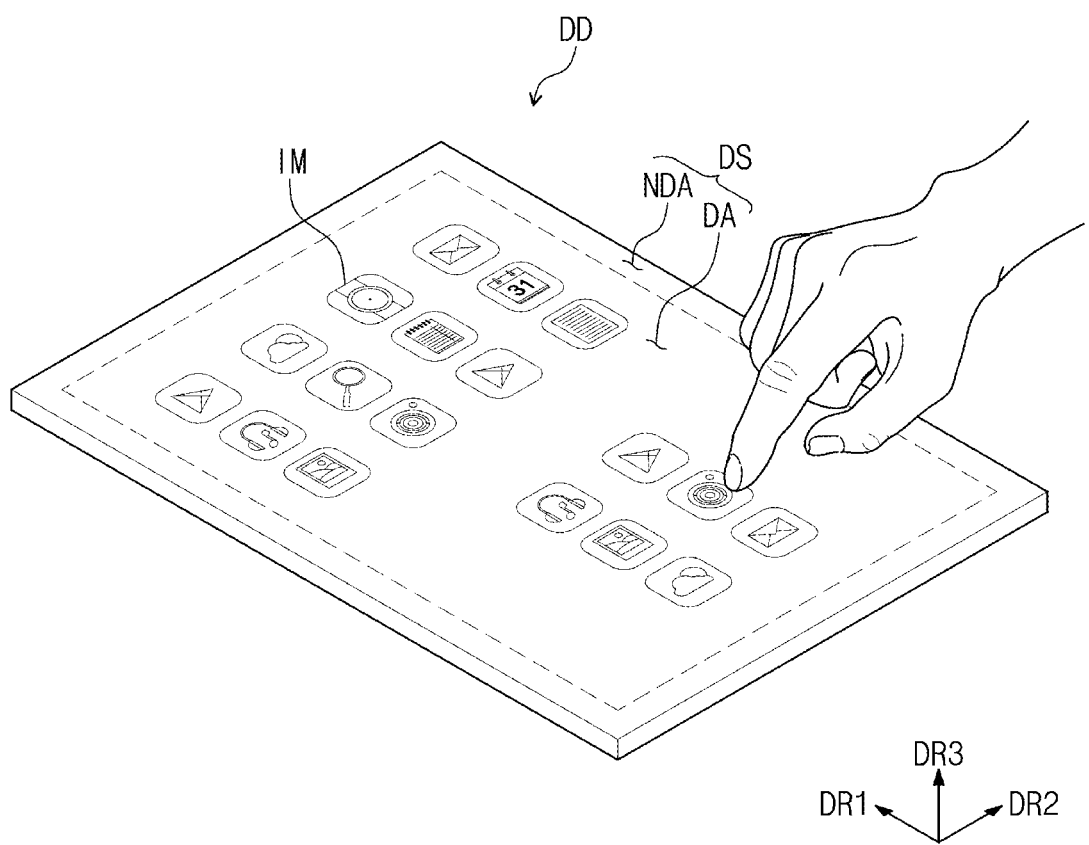
FIG. 1 is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process may be performed differently from the described order. For example, two consecutively described processes may be performed substantially at the same time or performed in an order opposite to the described order. Also, like reference numerals denote like elements.

When an element or a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of an exemplary embodiment of a display device DD constructed according to the principles of the invention.

Referring to FIG. 1, the display device DD may have a rectangular shape defined by long sides extending in a first direction DR1 and short sides extending in a second direction DR2 crossing the first direction DR1. However, the shape of the display device DD should not be limited to the rectangular shape, and the display device DD may have a variety of shapes, such as a circular shape or a polygonal shape other than the rectangular shape.

Hereinafter, a direction substantially perpendicular to a plane defined by the first direction DR1 and the second direction DR2 may be referred to as a "third direction DR3".

An upper surface of the display device DD may be referred to as a "display surface DS" and may be a plane surface defined by the first direction DR1 and the second direction DR2. Images IM generated by the display device DD may be provided to a user through the display surface DS.

The display surface DS may include a display area DA and a non-display area NDA defined around the display area DA. The display area DA may display the image, and the non-display area NDA may not display the image. The non-display area NDA may surround the display area DA and may define an edge of the display device DD, which is printed by a predetermined color.

The display device DD may be applied to a large-sized electronic item, such as a television set, a monitor, or an outdoor billboard, and a small and medium-sized electronic item, such as a personal computer, a notebook computer, a personal digital assistant, a car navigation unit, a game unit, a smartphone, a tablet computer, and a camera. However, these are merely exemplary, and the display device DD may be applied to other electronic items as long as they do not depart from the inventive concept of the embodiments.

Figure 2:
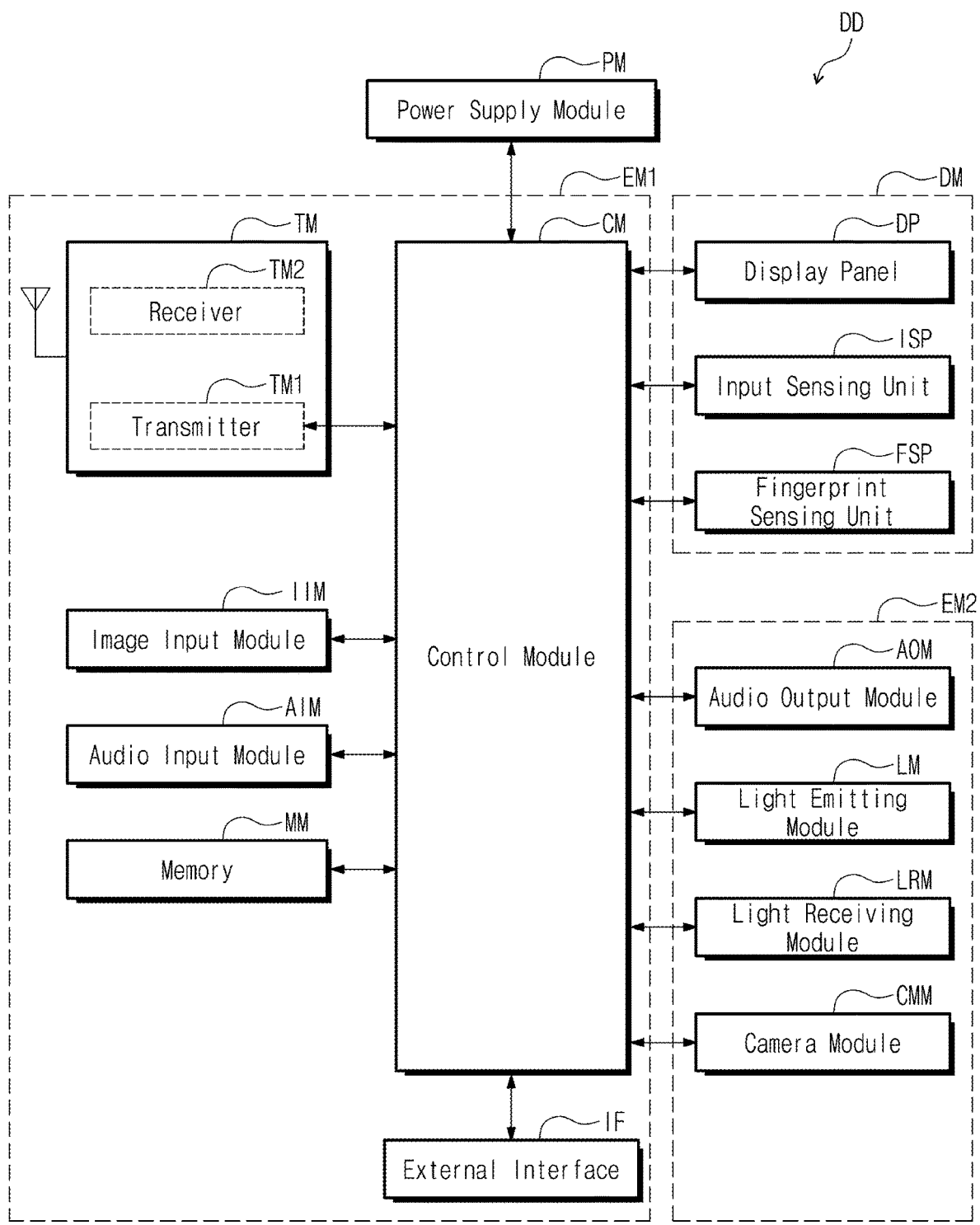
FIG. 2 is a block diagram of the display device shown in FIG. 1.

FIG. 2 is a block diagram of the display device DD shown in FIG. 1.

Referring to FIG. 2, the display device DD may include a display module DM, a power supply module PM, a first electronic module EM1, and a second electronic module EM2. The display module DM, the power supply module PM, the first electronic module EM1, and the second electronic module EM2 may be electrically connected to each other.

The power supply module PM may supply a power source necessary for an overall operation of the display device DD. The power supply module PM may include a normal battery module.

The first electronic module EM1 and the second electronic module EM2 may include a variety of functional modules to drive the display device DD. The first electronic module EM1 may be mounted directly on a main board electrically connected to the display module DM or may be electrically connected to the main board via a connector (not shown) after being mounted on a separate substrate.

The first electronic module EM1 may include a control module CM, a wireless communication module TM, an image input module IIM, an audio input module AIM, a memory MM, and an external interface IF. Some modules among the modules may be electrically connected to the main board through a flexible circuit board without being mounted on the main board.

The control module CM may control an overall operation of the display device DD. The control module CM may activate or deactivate the display module DM. The control module CM may control other modules, such as the image input module IIM or the audio input module AIM, based on a touch signal provided from the display module DM. In addition, the control module CM may perform a user authentication mode using fingerprint information provided from the display module DM.

The wireless communication module TM may transmit/receive a wireless signal to/from other terminals using a Bluetooth or WiFi link. The wireless communication module TM may transmit/receive a voice signal using a general communication line. The wireless communication module TM may include a transmitter TM1 that modulates a signal to be transmitted and transmits the modulated signal and a receiver TM2 that demodulates a signal applied thereto.

The image input module TIM may process an image signal and may convert the image signal into image data that may be displayed through the display module DM. The audio input module AIM may receive an external sound signal through a microphone in a record mode or a voice recognition mode and may convert the external sound signal to electrical voice data.

The external interface IF may serve as an interface between the control module CM and external devices, such as an external charger, a wired/wireless data port, a card e.g., a memory card and a SIM/UIM card, etc.

The second electronic module EM2 may include an audio output module AOM, a light emitting module LM, a light receiving module LRM, and a camera module CMM. The modules may be mounted directly on the main board, may be electrically connected to the display module DM through a connector (not shown) after being mounted on a separate substrate, or may be electrically connected to the first electronic module EM1.

The audio output module AOM may convert audio data provided from the wireless communication module TM or audio data stored in the memory MM and may output the converted audio data to the outside. The light emitting module LM may generate a light and may output the light. The light emitting module LM may emit an infrared ray. The light emitting module LM may include an LED element. The light receiving module LRM may sense the infrared ray. The light receiving module LRM may be activated when the infrared ray having a predetermined level or higher is sensed. The light receiving module LRM may include a complementary metal oxide semiconductor (CMOS) sensor.

The infrared ray generated by and output from the light emitting module LM may be reflected by an external object, e.g., a user's finger or face, and the reflected infrared ray may be incident into the light receiving module LRM. The camera module CMM may take an image of an external object.

The display module DM may include a display panel DP, an input sensing unit ISP, and a fingerprint sensing unit FSP. The display panel DP may display the image using the image data provided from the control module CM. The control module CM may drive the display module DM in an initial mode and a main mode following the initial mode. In detail, the display panel DP may be driven in the initial mode and the main mode in response to the control by the control module CM, and thus, may display an image corresponding to the initial mode and an image corresponding to the main mode.

In the initial mode, the control module CM may perform the user authentication mode. When the user is authenticated as an owner of the display device DD in the initial mode, the control module CM may drive the display panel DP in the main mode. In the main mode, the display panel DP may display a variety of images desired by the user. A user authentication method may be performed in a fingerprint authentication method.

The input sensing unit ISP may sense an external input, e.g., a user's hand or a touch pen, and may transmit the sensed signal to the control module CM as an input signal. The control module CM may control an operation of the display panel DP in response to the input signal. When a fingerprint of a finger is provided to the display panel DP, the input sensing unit ISP may provide touch information of the fingerprint to the control module CM.

The fingerprint sensing unit FSP may sense the fingerprint of the finger touching the display module DM when the display panel DP is driven in the initial mode. Fingerprint information sensed by the fingerprint sensing unit FSP may be transmitted to the control module CM.

The control module CM may receive the touch information of the fingerprint and may control an operation of the fingerprint sensing unit FSP. The control module CM may control the fingerprint sensing unit FSP to sense the fingerprint of the finger touching the display module DM when receiving the touch information of the fingerprint.

The control module CM may compare the sensed fingerprint information with user's fingerprint information stored therein. When the sensed fingerprint information match the user's fingerprint information, the control module CM may drive the display panel DP such that the mode of the display panel DP is switched from the initial mode to the main mode.

When the control module CM does not receive the touch information of the fingerprint, the control module CM may control the fingerprint sensing unit FSP such that a current generated by the fingerprint sensing unit FSP is charged in a capacitive element. This operation will be described in detail later.

Figure 3:
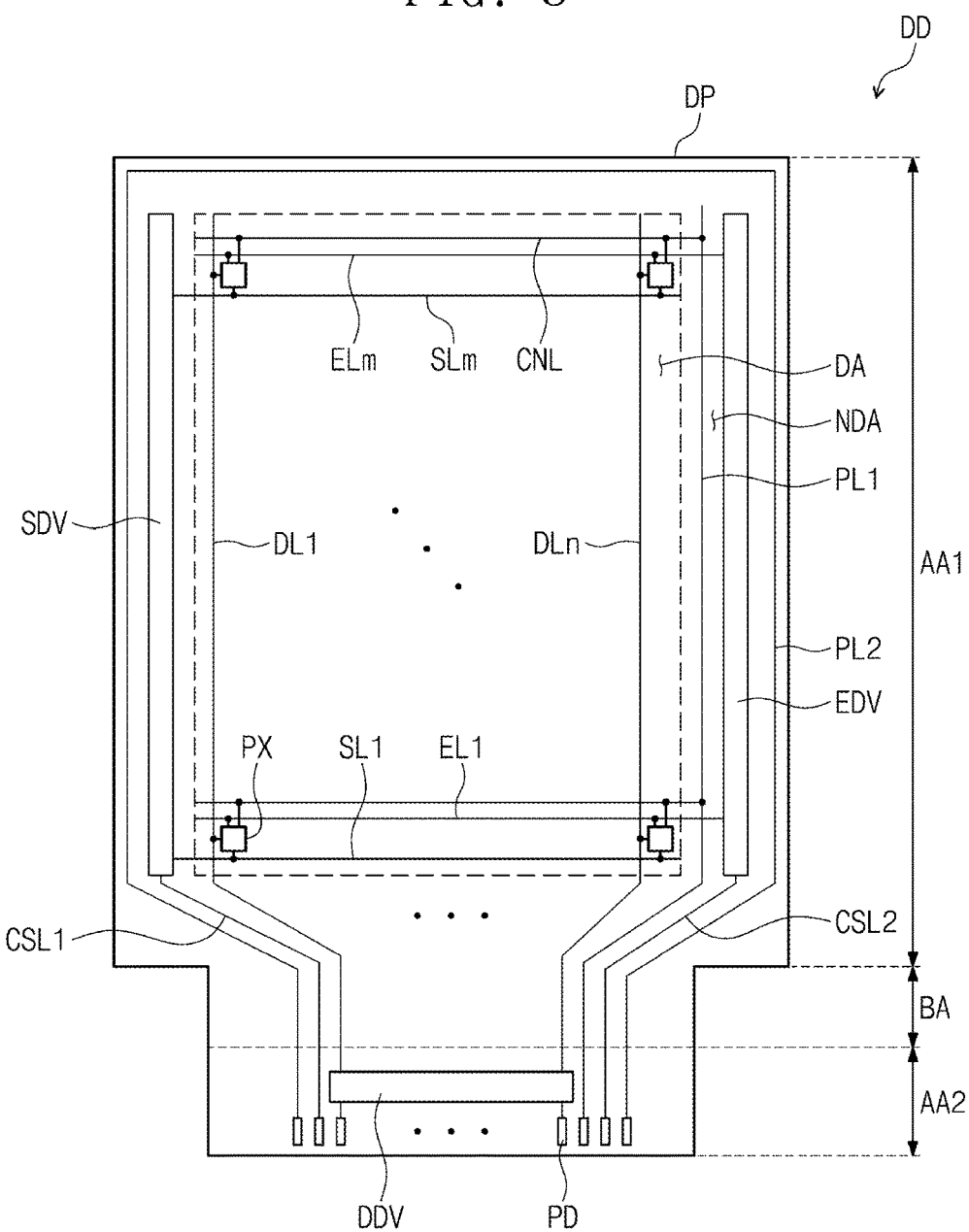
FIG. 3 is a plan view of the display device shown in FIG. 1.
Figure 3:
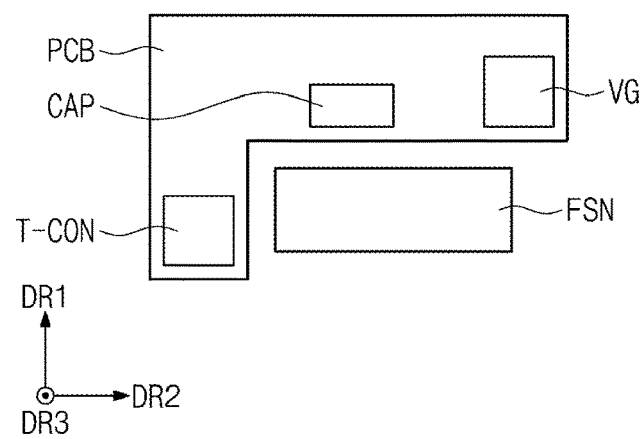

FIG. 3 is a plan view of the display device DD shown in FIG. 1.

Referring to FIG. 3, the display device DD may include the display panel DP, a scan driver SDV, a data driver DDV, an emission driver EDV, a printed circuit board PCB, the capacitive element CAP, a voltage generator VG, a timing controller T-CON, and a fingerprint sensor FSN.

The display panel DP may be a light-emitting type display panel, however, it should not be particularly limited. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot and a quantum rod. Hereinafter, the organic light emitting display panel will be described as a representative example of the display panel DP.

The display panel DP may be a flexible display panel. For example, display panel DP may include a plurality of electrical elements arranged on a flexible substrate. The display panel DP may extend longer in the first direction DR1 than in the second direction DR2. The display panel DP may include a plane defined by the first and second directions DR1 and DR2.

The display panel DP may include a first area AA1, a second area AA2, and a bendable area BA disposed between the first area AA1 and the second area AA2. The first area AA1, the bendable area BA, and the second area AA2 may be arranged in the first direction DR1, and the bendable area BA may extend in the second direction DR2. The bendable area BA may extend in the first direction DR1 from the first area AA1, and the second area AA2 may extend in first direction DR1 from the bendable area BA.

The first area AA1 may include long sides extending in the first direction DR1 and opposite to each other in the second direction DR2. The bendable area BA and the second area AA2 may have a length smaller than a length of the first area AA1 in the second direction DR2.

The first area AA1 may include the display area DA and the non-display area NDA around the display area DA. The non-display area NDA may surround the display area DA. The display area DA may display the image, and the non-display area NDA may not display the image. The second area AA2 and the bendable area BA may not display the image.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, a first power line PL1, a second power line PL2, a plurality of connection lines CNL, and a plurality of pads PD. Each of "m" and "n" is a natural number. The pixels PX may be arranged in the display area DA and may be connected to the scan lines SL1 to SLm, the data lines DL1 to DLn, and the emission lines EL1 to ELm.

The scan driver SDV and the emission driver EDV may be disposed in the non-display area NDA. The scan driver SDV and the emission driver EDV may be disposed in the non-display area NDA to be respectively adjacent to long sides of the first area AA1. The data driver DDV may be disposed in the second area AA2.

The data driver DDV may be mounted in the second area AA2 after being manufactured in an integrated circuit chip form. The data driver DDV may be referred to as a driving IC. The scan lines SL1 to SLm may extend in the second direction DR2 and may be connected to the scan driver SDV. The data lines DL1 to DLn may extend in the first direction DR1 and may be connected to the data driver DDV via the bendable area BA. The emission lines EL1 to ELm may extend in the second direction DR2 and may be connected to the emission driver EDV.

The first power line PL1 may extend in the first direction DR1 and may be disposed in the non-display area NDA. The first power line PL1 may be disposed between the display area DA and the emission driver EDV, however, it should not be limited thereto or thereby. The first power line PL1 may be disposed between the display area DA and the scan driver SDV.

The first power line PL1 may extend in the second area AA2 through the bendable area BA. The first power line PL1 may extend to a lower end of the second area AA2 when viewed in a plane. The first power line PL1 may receive a first voltage.

The second power line PL2 may be disposed in the non-display area NDA that faces the second area AA2 with the display area DA interposed therebetween and the non-display area NDA adjacent to the long sides of the first area AA1. The second power line PL2 may be disposed outside of the scan driver SDV and the emission driver EDV.

The second power line PL2 may extend in the second area AA2 through the bendable area BA. The second power line PL2 may extend along the first direction DR1 in the second area AA2 such that the data driver DDV is disposed between both ends of the second power lines PL2. The second power line PL2 may extend toward the lower end of the second area AA2 when viewed in a plane.

The second power line PL2 may receive a second voltage having a voltage level lower than that of the first voltage. For the convenience of explanation, although a connection relationship is not shown, the second power line PL2 may extend in the display area DA and may be connected to the pixels PX, and the second voltage may be applied to the pixels PX through the second power line PL2.

The connection lines CNL may extend in the second direction DR2 and may be arranged in the first direction DR1. The connection lines CNL may be connected to the first power line PL1 and the pixels PX. The first voltage may be applied to the pixels PX through the first power line PL1 and the connection lines CNL connected to the first power line PL1.

The first control line CSL1 may be connected to the scan driver SDV and may extend toward the lower end of the second area AA2 through the bendable area BA. The second control line CSL2 may be connected to the emission driver EDV and may extend toward the lower end of the second area AA2 through the bendable area BA. The data driver DDV may be disposed between the first control line CSL1 and the second control line CSL2.

When viewed in a plane, the pads PD may be disposed to be adjacent to the lower end of the second area AA2. The data driver DDV, the first power line PL1, the second power line PL2, the first control line CSL1, and the second control line CSL2 may be connected to the pads PD.

The data lines DL1 to DLn may be connected to corresponding pads PD through the data driver DDV. For example, the data lines DL1 to DLn may be connected to the data driver DDV, and the data driver DDV may be connected to the pads PD respectively corresponding to the data lines DL1 to DLn.

The printed circuit board PCB may be connected to the pads PD. The timing controller T-CON may be disposed on the printed circuit board PCB. The timing controller T-CON may be manufactured in an integrated circuit chip and may be mounted on the printed circuit board PCB. The timing controller T-CON may be connected to the pads PD through the printed circuit board PCB.

The voltage generator VG may be disposed on the printed circuit board PCB. The voltage generator VG may be connected to the pads PD connected to the first and second power lines PL1 and PL2.

The fingerprint sensor FSN may be adjacent to the printed circuit board PCB. Although not shown in figures, the fingerprint sensor FSN may be connected to the voltage generator VG and the capacitive element CAP.

The capacitive element CAP may be disposed on the printed circuit board PCB, however, it should not be limited thereto or thereby. The capacitive element CAP may be disposed at a variety of positions. For example, the capacitive element CAP may be disposed outside the printed circuit board PCB and may be connected to the printed circuit board PCB through a connector (not shown).

The capacitive element CAP may be connected to the voltage generator VG. The capacitive element CAP may include a capacitor. The capacitor of the capacitive element CAP may have various capacitances. For example, the capacitive element CAP may have the capacitance from several hundred farads (F) to several thousand farads (F).

The timing controller T-CON may control an operation of the scan driver SDV, the data driver DDV, and the emission driver EDV. The timing controller T-CON may generate a scan control signal, a data control signal, and an emission control signal in response to control signals applied thereto from an external source (not shown).

Figure 9:
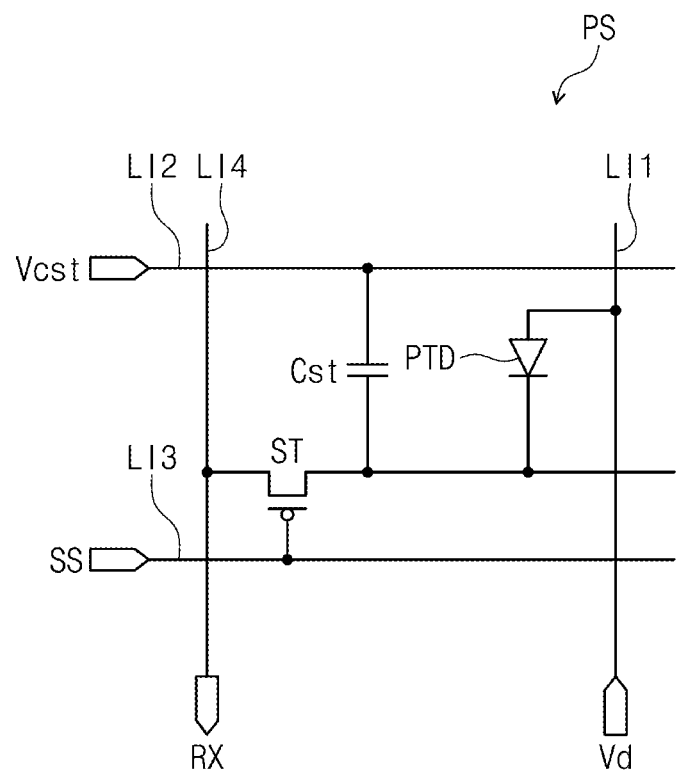
FIG. 9 is an equivalent circuit diagram of an exemplary embodiment of a photo sensor included in the fingerprint sensor.

The fingerprint sensing unit FSP shown in FIG. 2 may include the fingerprint sensor FSN. For example, as shown in FIG. 9, the fingerprint sensor FSN may include a plurality of photo sensors PS, and each of the photo sensors PS may include a photodiode PTD. The photo sensors PS may convert a light energy to an electrical energy. The fingerprint sensor FSN may sense the fingerprint provided on the display panel DP. In addition, the fingerprint sensor FSN may convert an external light and an internal light to the electrical energy.

The capacitive element CAP may receive the electrical energy from the fingerprint sensor FSN through the voltage generator VG and may be charged with the electrical energy. The capacitive element CAP may serve as an auxiliary battery. The electrical energy charged in the capacitive element CAP may be provided to the voltage generator VG.

The scan control signal may be applied to the scan driver SDV through the first control line CSL1. The emission control signal may be applied to the emission driver EDV through the second control line CSL2. The data control signal may be applied to the data driver DDV. The timing controller T-CON may receive image signals from the outside, may convert a data format of the image signals to a format appropriate to an interface between the timing controller T-CON and the data driver DDV, and may provide the image signals having the converted format to the data driver DDV.

The scan driver SDV may generate a plurality of scan signals in response to the scan control signal. The scan signals may be applied to the pixels PX through the scan lines SL1 to SLm. The scan signals may be sequentially applied to the pixels PX.

The data driver DDV may generate a plurality of data voltages corresponding to the image signals in response to the data control signal. The data voltages may be applied to the pixels PX through the data lines DL1 to DLn. The emission driver EDV may generate a plurality of light emitting signals in response to the emission control signal. The light emitting signals may be applied to the pixels PX through the emission lines EL1 to ELm.

The pixels PX may receive the data voltages in response to the scan signals. The pixels PX may emit a light having brightness corresponding to the data voltages in response to the light emitting signals, and thus, may display the image. A light emitting time of the pixels PX may be controlled by the light emitting signals.

Figure 4:
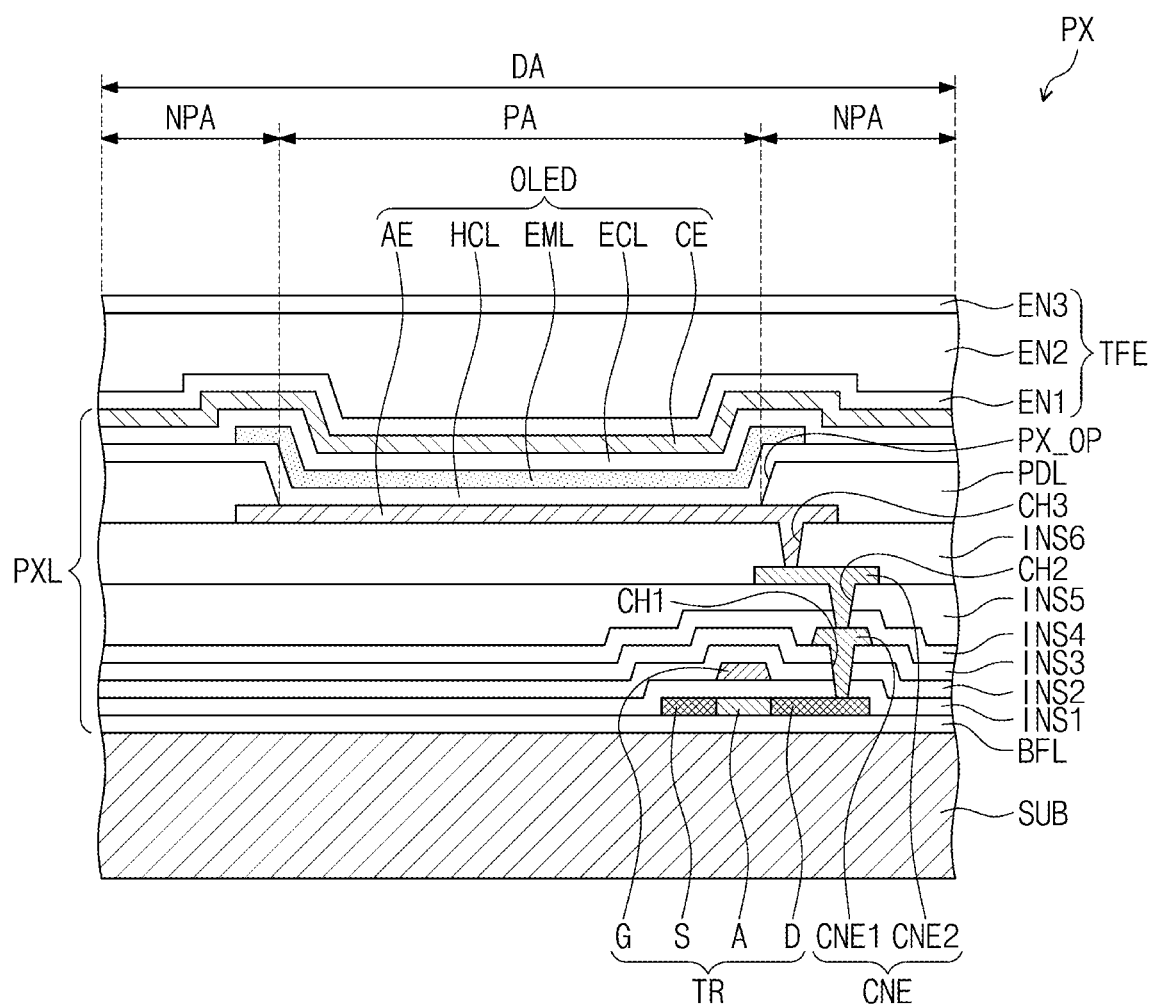
FIG. 4 is a cross-sectional view of a pixel included in the display device shown in FIG. 3.

FIG. 4 is a cross-sectional view of a pixel PX included in the display device DD shown in FIG. 3.

Referring to FIG. 4, the pixel PX may be disposed on a substrate SUB and may include a transistor TR and a light emitting element OLED. The light emitting element OLED may include a first electrode AE, a second electrode CE, a hole control layer HCL, an electron control layer ECL, and a light emitting layer EML. The first electrode AE may be an anode electrode, and the second electrode CE may be a cathode electrode.

The transistor TR and the light emitting element OLED may be disposed on the substrate SUB. As an example, one transistor TR is shown in FIG. 4, however, the pixel PX may include a plurality of transistors and at least one capacitive element to drive the light emitting element OLED.

The display area DA may include a light emitting area PA corresponding to each pixel PX and a non-light-emitting area NPA around the light emitting area PA. The light emitting element OLED may be disposed in the light emitting area PA.

The substrate SUB may include a flexible plastic material. As an example, the substrate SUB may include transparent polyimide (PI). A buffer layer BFL may be disposed on the substrate SUB, and the buffer layer BFL may be an inorganic layer. A semiconductor pattern may be disposed on the buffer layer BFL. The semiconductor pattern may include a polycrystalline silicon, however, it should not be limited thereto or thereby. The semiconductor pattern may include amorphous silicon or metal oxide.

The semiconductor pattern may be doped with an N-type dopant or a P-type dopant. The semiconductor pattern may have different electrical properties depending on whether it is doped with the P-type dopant or the N-type dopant. The semiconductor pattern may include a high-doped region and a low-doped region. The high-doped region may have a conductivity greater than that of the low-doped region and may substantially serve as a source and a drain of the transistor TR. The low-doped region may substantially correspond to an active (or channel) of the transistor TR.

A source S, an active A, and a drain D of the transistor TR may be formed from the semiconductor pattern. A first insulating layer INS1 may be disposed on the semiconductor pattern. A gate G of the transistor TR may be disposed on the first insulating layer INS1. A second insulating layer INS2 may be disposed on the first insulating layer INS1 to cover the gate G. A third insulating layer INS3 may be disposed on the second insulating layer INS2.

A connection electrode CNE may be disposed between the transistor TR and the light emitting element OLED to connect the transistor TR to the light emitting element OLED. The connection electrode CNE may include a first connection electrode CNE1 and a second connection electrode CNE2.

The first connection electrode CNE1 may be disposed on the third insulating layer INS3 and may be connected to the drain D through a first contact hole CH1 defined through the first, second, and third insulating layers INS1, INS2, and INS3. A fourth insulating layer INS4 may be disposed on the third insulating layer INS3 to cover the first connection electrode CNE1. A fifth insulating layer INS5 may be disposed on the fourth insulating layer INS4.

The second connection electrode CNE2 may be disposed on the fifth insulating layer INS5 and may be connected to the first connection electrode CNE1 through a second contact hole CH2 defined through the fourth insulating layer INS4 and the fifth insulating layer INS5. A sixth insulating layer INS6 may be disposed on the fifth insulating layer INS5 to cover the second connection electrode CNE2. Each of the first to sixth insulating layers INS1 to INS6 may be an inorganic layer or an organic layer.

The first electrode AE may be disposed on the sixth insulating layer INS6. The first electrode AE may be connected to the second connection electrode CNE2 through a third contact hole CH3 defined through the sixth insulating layer INS6. A pixel definition layer PDL may be disposed on the first electrode AE and the sixth insulating layer INS6 to expose a predetermined portion of the first electrode AE. The pixel definition layer PDL may be provided with an opening PX_OP defined therethrough to expose the portion of the first electrode AE.

The hole control layer HCL may be disposed on the first electrode AE and the pixel definition layer PDL. The hole control layer HCL may be commonly disposed in the light emitting area PA and the non-light-emitting area NPA. The hole control layer HCL may include a hole transport layer and a hole injection layer.

The light emitting layer EML may be disposed on the hole control layer HCL. The light emitting layer EML may be disposed in an area corresponding to the opening PX_OP. The light emitting layer EML may include an organic material and/or an inorganic material. The light emitting layer EML may generate a light having one of red, green, and blue colors.

The electron control layer ECL may be disposed on the light emitting layer EML and the hole control layer HCL. The electron control layer ECL may be commonly disposed in the light emitting area PA and the non-light-emitting area NPA. The electron control layer ECL may include an electron transport layer and an electron injection layer.

The second electrode CE may be disposed on the electron control layer ECL. The second electrode CE may be commonly disposed in the pixels PX. Layers from the buffer layer BFL to the light emitting element OLED may be referred to as a pixel layer PXL.

A thin film encapsulation layer TFE may be disposed on the light emitting element OLED. The thin film encapsulation layer TFE may be disposed on the second electrode CE to cover the pixel PX. The thin film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2.

Each of the first and third encapsulation layers EN1 and EN3 may be an inorganic layer, and the second encapsulation layer EN2 may be an organic layer. The first and third encapsulation layers EN1 and EN3 may protect the pixel PX from moisture and oxygen. The second encapsulation layer EN2 may protect the pixel PX from a foreign substance such as dust particles.

The first voltage may be applied to the first electrode AE through the transistor TR, and the second voltage, which has a voltage level lower than that of the first voltage, may be applied to the second electrode CE. Holes and electrons injected into the light emitting layer EML may be recombined to generate excitons, and the light emitting element OLED may emit the light by the excitons that return to a ground state from an excited state.

Figure 5:
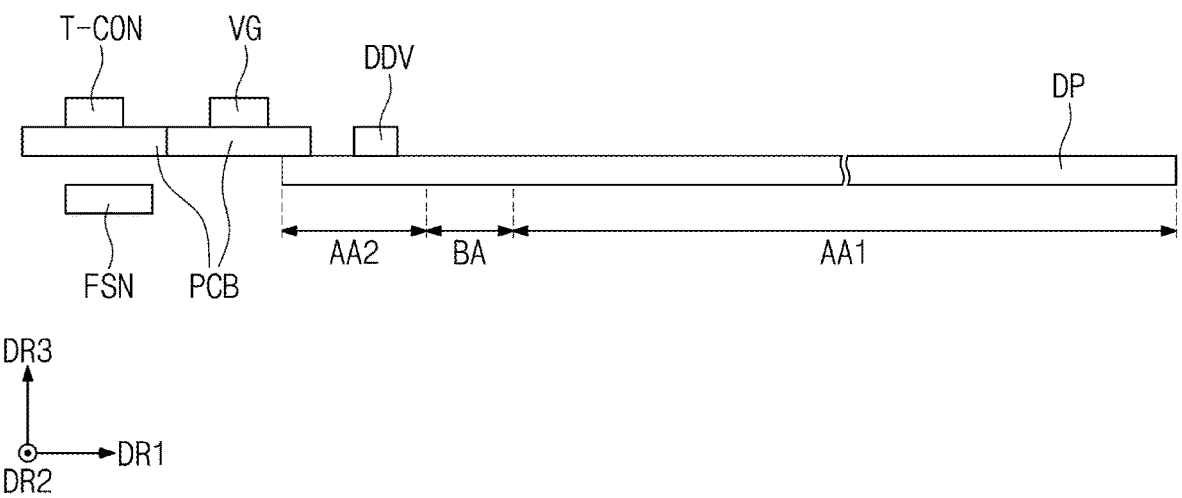
FIG. 5 is a side view of the display panel shown in FIG. 3.
Figure 6:
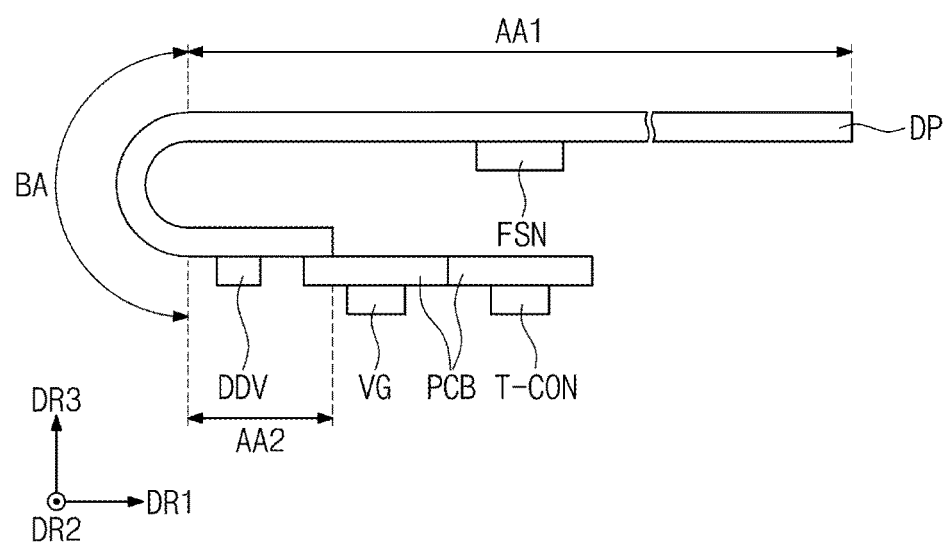
FIG. 6 is a side view of the display panel in a bent position shown in FIG. 5.
Figure 7:
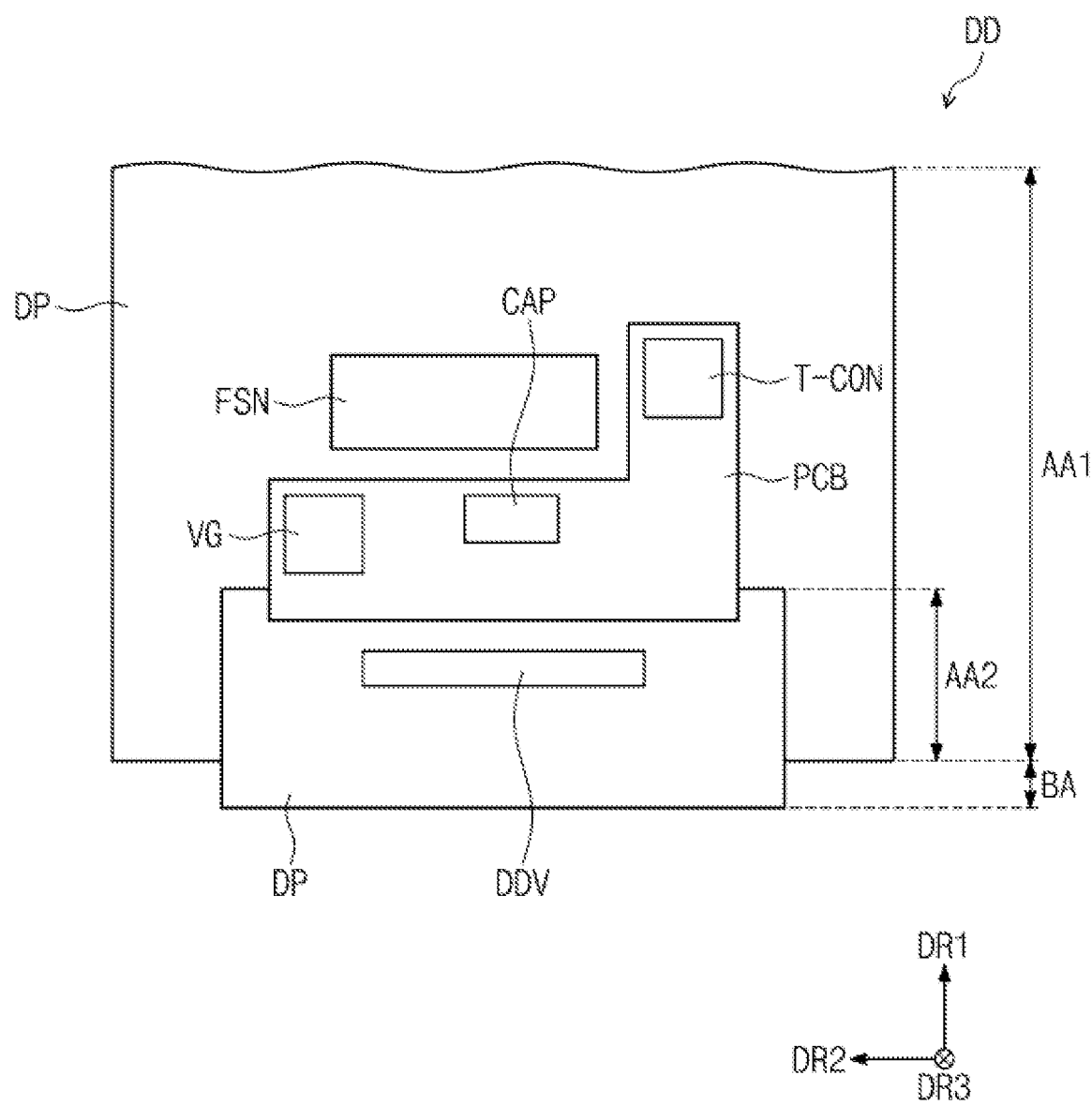
FIG. 7 is a plan view of a rear surface of the display panel shown in FIG. 6.

FIG. 5 is a side view of the display panel DP shown in FIG. 3. FIG. 6 is a side view of the display panel DP in a bent position shown in FIG. 5. FIG. 7 is a plan view of a rear surface of the display panel DP shown in FIG. 6.

As an example, FIG. 5 shows a side surface of the display panel DP when viewed in the second direction DR2, and the printed circuit board PCB is connected to the display panel DP.

Referring to FIGS. 5 and 6, the timing controller T-CON and the voltage generator VG may be disposed on the printed circuit board PCB. Although the capacitive element CAP is not shown due to its position when viewed in the side view, the capacitive element CAP may be disposed on the printed circuit board PCB. The printed circuit board PCB may be connected to the second area AA2.

Referring to FIGS. 6 and 7, the bendable area BA may be bent, and thus, the second area AA2 may be disposed under the first area AA1. The printed circuit board PCB may be disposed under the display panel DP. The timing controller T-CON and the voltage generator VG may be disposed under the display panel DP. The fingerprint sensor FSN may be disposed under the display panel DP. The fingerprint sensor FSN may be disposed adjacent to the printed circuit board PCB. The fingerprint sensor FSN may be disposed under a portion of the display panel DP.

Figure 8:
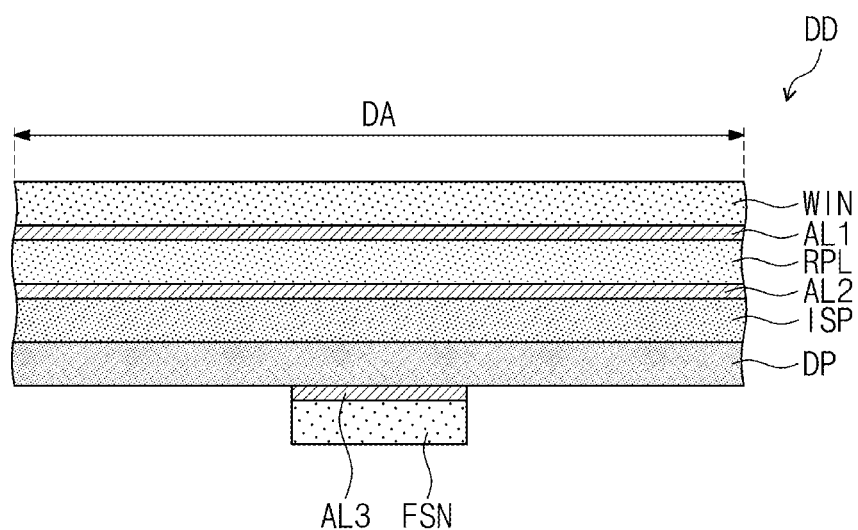
FIG. 8 is a cross-sectional view of a portion corresponding to the fingerprint sensor of the display device shown in FIG. 7.

FIG. 8 is a cross-sectional view of a portion corresponding to the fingerprint sensor FSN of the display device DD shown in FIG. 7.

Referring to FIG. 8, the display device DD may include the fingerprint sensor FSN, the display panel DP, the input sensing unit ISP, an anti-reflective layer RPL, a window WIN, and first, second, and third adhesive layers AL1, AL2, and AL3.

However, the configurations of the display device DD should not be limited thereto or thereby, and the display device DD may include additional components between the above components. For example, a protective film may be disposed under the display panel DP, and the fingerprint sensor FSN may be disposed under the protective film. The protective film may be attached to the display panel DP by a separate adhesive layer. In addition, an optical system and an infrared cut-off filter may be included in the fingerprint sensor FSN or may be disposed on the fingerprint sensor FSN after being separately manufactured.

The protective film may protect the display panel DP from an external scratch. The optical system may change a path of a light or may refract the light so that the light reflected by the fingerprint is easily provided to the fingerprint sensor FSN. When an infrared ray of the external light is provided to the fingerprint sensor FSN after passing through the fingerprint, the fingerprint may not be normally sensed. The infrared cut-off filter may block the infrared ray of the light incident thereto from the outside. The infrared ray traveling to the fingerprint sensor FSN from the outside may be blocked by the infrared cut-off filter.

The fingerprint sensor FSN may be disposed under the display panel DP. The fingerprint sensor FSN may overlap a portion of the display area DA. The fingerprint sensor FSN may sense the fingerprint provided on the display panel DP. In addition, the fingerprint sensor FSN may convert the external light to the electrical energy.

The input sensing unit ISP may be disposed directly on the display panel DP. For example, the input sensing unit ISP may be manufactured directly on the thin film encapsulation layer when the display device DD is manufactured, however, it should not be limited thereto or thereby. The input sensing unit ISP may be attached to the display panel DP by an adhesive layer after being manufactured separately from display panel DP.

The input sensing unit ISP may include a plurality of sensor units (not shown) to sense an external input. The sensor units may sense the external input by a capacitance method.

The anti-reflective layer RPL may be disposed on the input sensing unit ISP. The anti-reflective layer RPL may reduce a reflectance of the external light incident to the display panel DP from the above of the display device DD. As an example, the anti-reflective layer RPL may include a polarizing film that reduces the reflectance of the external light, and the polarizing film may include a retarder and/or a polarizer.

The window WIN may be disposed on the anti-reflective layer RPL. The window WIN may have an optically transparent property. The window WIN may include a transparent plastic or glass. The window WIN may protect the display panel DP, the input sensing unit ISP, and the anti-reflective layer RPL from the external scratch and impact.

The first adhesive layer AL1 may be disposed between the window WIN and the anti-reflective layer RPL. The window WIN and the anti-reflective layer RPL may be attached to each other by the first adhesive layer AL1.

The second adhesive layer AL2 may be disposed between the anti-reflective layer RPL and the input sensing unit ISP. The anti-reflective layer RPL and the input sensing unit ISP may be attached to each other by the second adhesive layer AL2.

The third adhesive layer AL3 may be disposed between the fingerprint sensor FSN and the display panel DP. The fingerprint sensor FSN and the display panel DP may be attached to each other by the third adhesive layer AL3. A sum of a thickness of the third adhesive layer AL3 and a thickness of the fingerprint sensor FSN may be equal to or smaller than about 0.1 mm.

The first to third adhesive layers AL1 to AL3 may include a transparent adhesive layer, such as a pressure sensitive adhesive (PSA) or an optically clear adhesive (OCA), however, the adhesive layer should not be limited thereto or thereby.

FIG. 9 is an equivalent circuit diagram of an exemplary embodiment of a photo sensor PS included in the fingerprint sensor FSN.

Referring to FIG. 9, the photo sensor PS may include the photodiode PTD, a switching transistor ST, and a storage capacitor Cst. An anode of the photodiode PTD may be connected to a first line LI1, and a cathode of the photodiode PTD may be connected to a source of the switching transistor ST. A driving voltage Vd may be supplied to the photodiode PTD through the first line LI1.

The storage capacitor Cst may be connected to a second line LI2 and the source of the switching transistor ST. A storage voltage Vcst may be applied to the second line LI2.

A gate of the switching transistor ST may be connected to a third line LI3, and a drain of the switching transistor ST may be connected to a fourth line LI4.

When the photodiode PTD is driven, the photodiode PTD may convert the light energy from the outside into the electrical energy. The storage capacitor Cst may be charged with the electrical energy as its electric charges.

A switching signal SS may be applied to the switching transistor ST through the third line LI3, and the switching transistor ST may be turned on by the switching signal SS. The electric charges charged in the storage capacitor Cst may be output as a sensing signal Rx through the turned-on switching transistor ST and the fourth line LI4. The fourth line LI4 may be referred to as a "read-out line".

Figure 10:
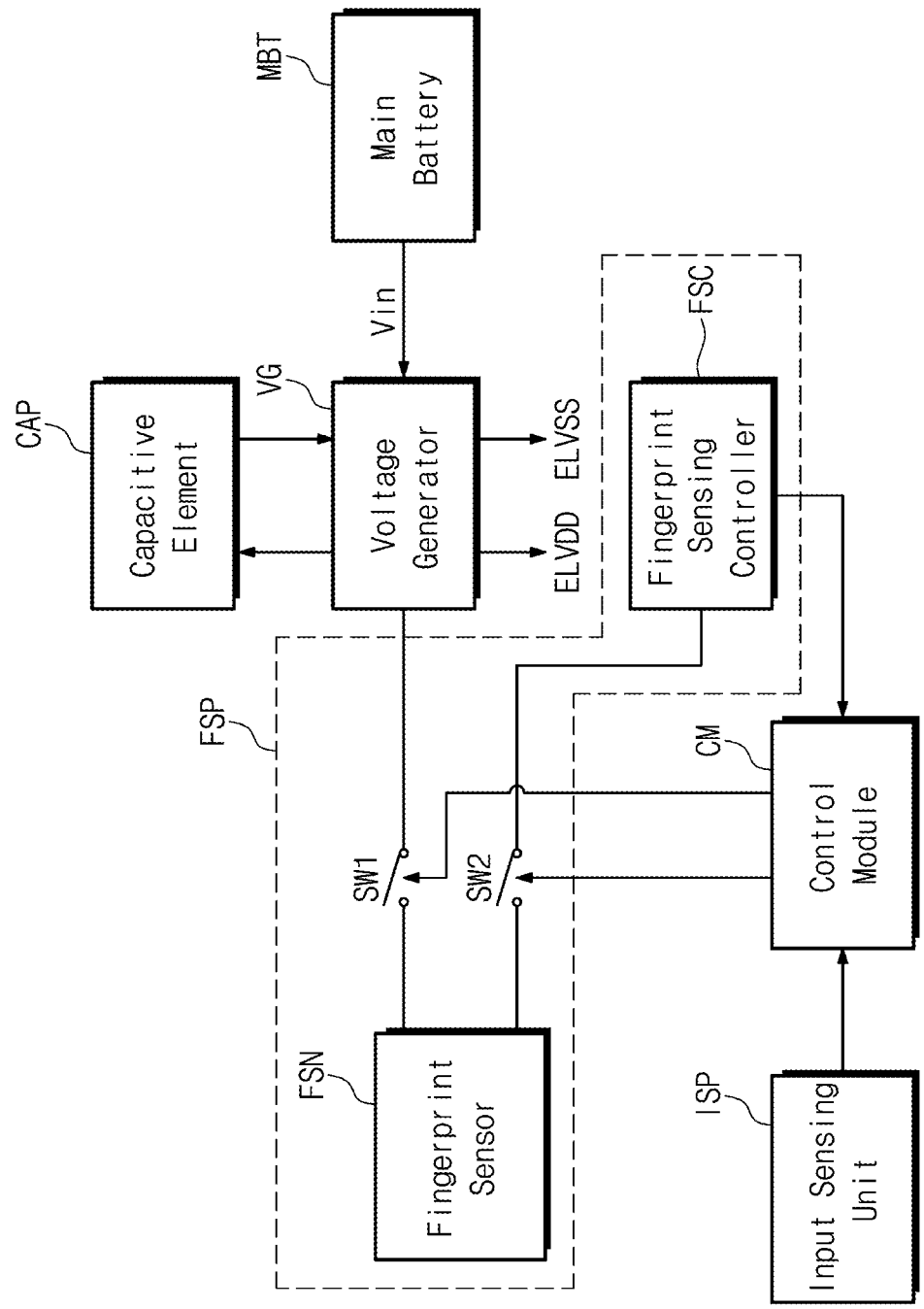
FIG. 10 is a block diagram showing a connection relation between a fingerprint sensing unit shown in FIG. 2 and components thereground.

FIG. 10 is a block diagram showing a connection relation between the fingerprint sensing unit FSP shown in FIG. 2 and components therearound.

Referring to FIG. 10, the fingerprint sensing unit FSP may include the fingerprint sensor FSN, a fingerprint sensing controller FSC, and first and second switches SW1 and SW2. The first switch SW1 may be connected to the fingerprint sensor FSN and the voltage generator VG. The second switch SW2 may be connected to the fingerprint sensor FSN and the fingerprint sensing controller FSC.

The fingerprint sensor FSN may be connected to the capacitive element CAP. In detail, the fingerprint sensor FSN may be connected to the voltage generator VG through the first switch SW1. The fingerprint sensor FSN may be connected to the capacitive element CAP through the voltage generator VG. However, they should not be limited thereto or thereby, and the fingerprint sensor FSN may be connected to the capacitive element CAP through the first switch SW1. The fingerprint sensor FSN may be connected to the fingerprint sensing controller FSC through the second switch SW2.

The fourth line LI4 (refer to FIG. 9) of the above-mentioned photo sensor PS may be connected to the voltage generator VG through the first switch SW1 or may be connected to the fingerprint sensing controller FSC through the second switch SW2.

The display device DD may include a main battery MBT, and the main battery MBT may be connected to the voltage generator VG. The main battery MBT may provide an input voltage Vin to the voltage generator VG. The voltage generator VG may receive the input voltage Vin and may generate the first voltage ELVDD and the second voltage ELVSS. The first voltage ELVDD and the second voltage ELVSS may be provided to the display panel DP.

The voltage generator VG may be connected to the capacitive element CAP. The voltage generator VG may provide the electrical energy from the fingerprint sensor FSN to the capacitive element CAP. The voltage generator VG may receive the electrical energy from the capacitive element CAP. That is, the capacitive element CAP may serve as the auxiliary battery for the voltage generator VG.

The fingerprint sensing controller FSC may be connected to the control module CM, and the control module CM may be connected to the input sensing unit ISP. The control module CM may control a switching operation of the first switch SW1 and the second switch SW2. For example, the control module CM may turn on or turn off the first and second switches SW1 and SW2.

As an example, each of the first switch SW1 and the second switch SW2 may be a transistor. In this case, the control module CM may provide a control signal to a gate of each of the first switch SW1 and the second switch SW2.

The fingerprint sensing controller FSC may receive the sensed fingerprint from the fingerprint sensor FSN. The fingerprint sensing controller FSC may process the fingerprint sensed by the fingerprint sensor FSN and may provide the processed fingerprint to the control module CM as fingerprint information.

Figure 11:
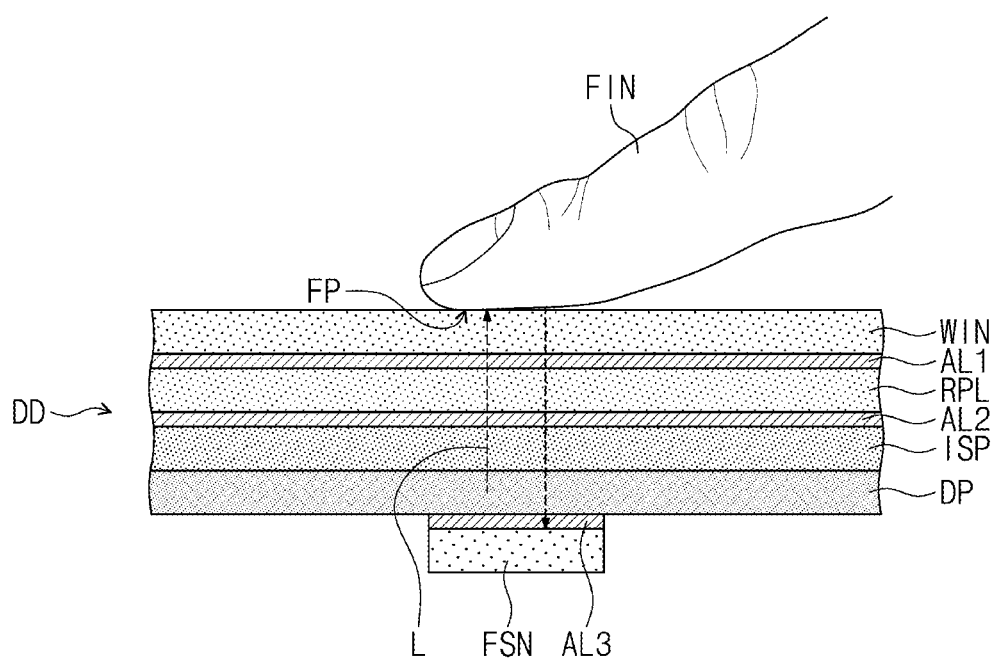
FIG. 11 is a cross-sectional view showing a fingerprint sensing operation of the fingerprint sensor shown in FIGS. 8 and 10.
Figure 12:
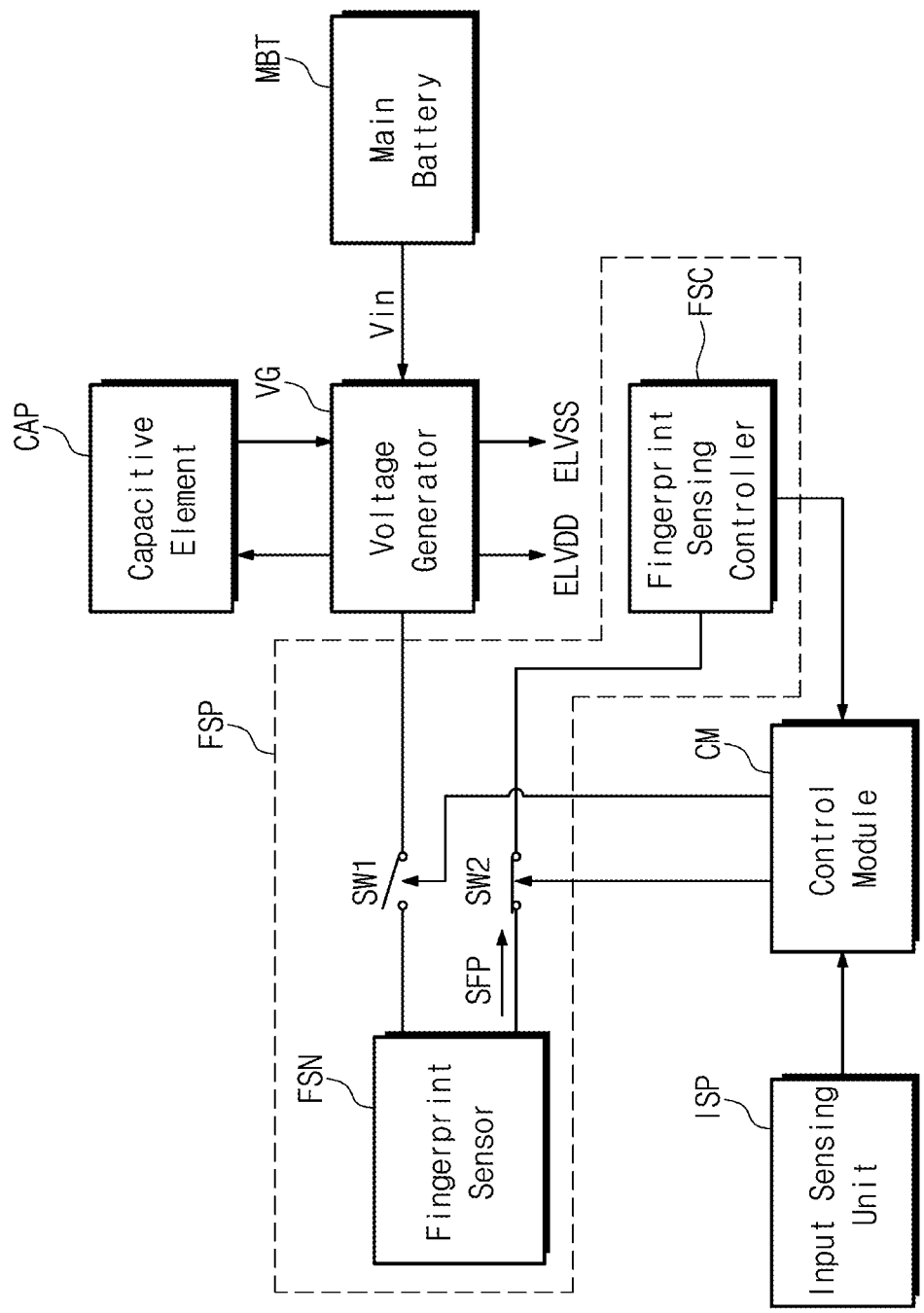
FIG. 12 is a block diagram showing a fingerprint sensing operation of the fingerprint sensing unit shown in FIG. 10.

FIG. 11 is a cross-sectional view showing a fingerprint sensing operation of the fingerprint sensor FSN shown in FIGS. 8 and 10. FIG. 12 is a block diagram showing a fingerprint sensing operation of the fingerprint sensing unit FSP shown in FIG. 10.

Referring to FIGS. 11 and 12, the display panel DP may generate a light L in the initial mode. When a finger FIN is provided on the display device DD in the initial mode, the fingerprint FP may be in contact with the display device DD. When the fingerprint FP touches the display device DD in the initial mode, the input sensing unit ISP may provide fingerprint touch information to the control module CM.

The control module CM may turn on the second switch SW2 and may turn off the first switch SW1 in response to the fingerprint touch information. That is, when the fingerprint FP touches the display device DD, the fingerprint sensor FSN may be connected to the fingerprint sensing controller FSC and may not be connected to the voltage generator VG and the capacitive element CAP.

The fingerprint sensor FSN may sense the fingerprint FP provided on the display device DD. The light L generated by the display panel DP may be provided to the fingerprint FP and may be reflected by the fingerprint FP. The light reflected by the fingerprint FP may be provided to the fingerprint sensor FSN. The fingerprint sensor FSN may sense the fingerprint FP using the light reflected by the fingerprint FP.

The fingerprint sensor FSN may provide a sensed fingerprint SFP to the fingerprint sensing controller FSC through the turned-on second switch SW2. The fingerprint sensing controller FSC may receive the sensed fingerprint SFP from the fingerprint sensor FSN and may process the sensed fingerprint SFP as the fingerprint information. The fingerprint sensing controller FSC may provide the fingerprint information to the control module CM.

The control module CM may perform a user authentication mode using the fingerprint information provided from the fingerprint sensing controller FSC. For example, the control module CM may authenticate whether the touched fingerprint FP is the user's fingerprint.

Figure 13:
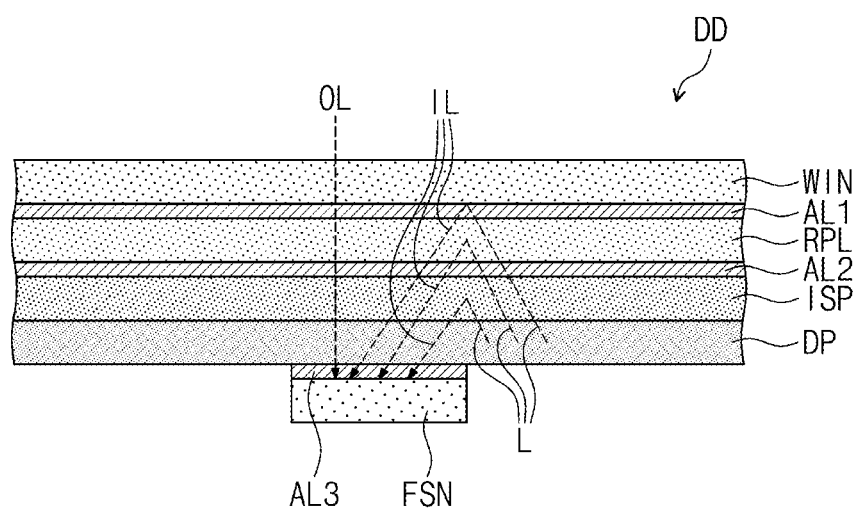
FIG. 13 is a cross-sectional view showing an operation of the fingerprint sensor shown in FIGS. 8 and 10 that receives an external light and an internal light.
Figure 14:
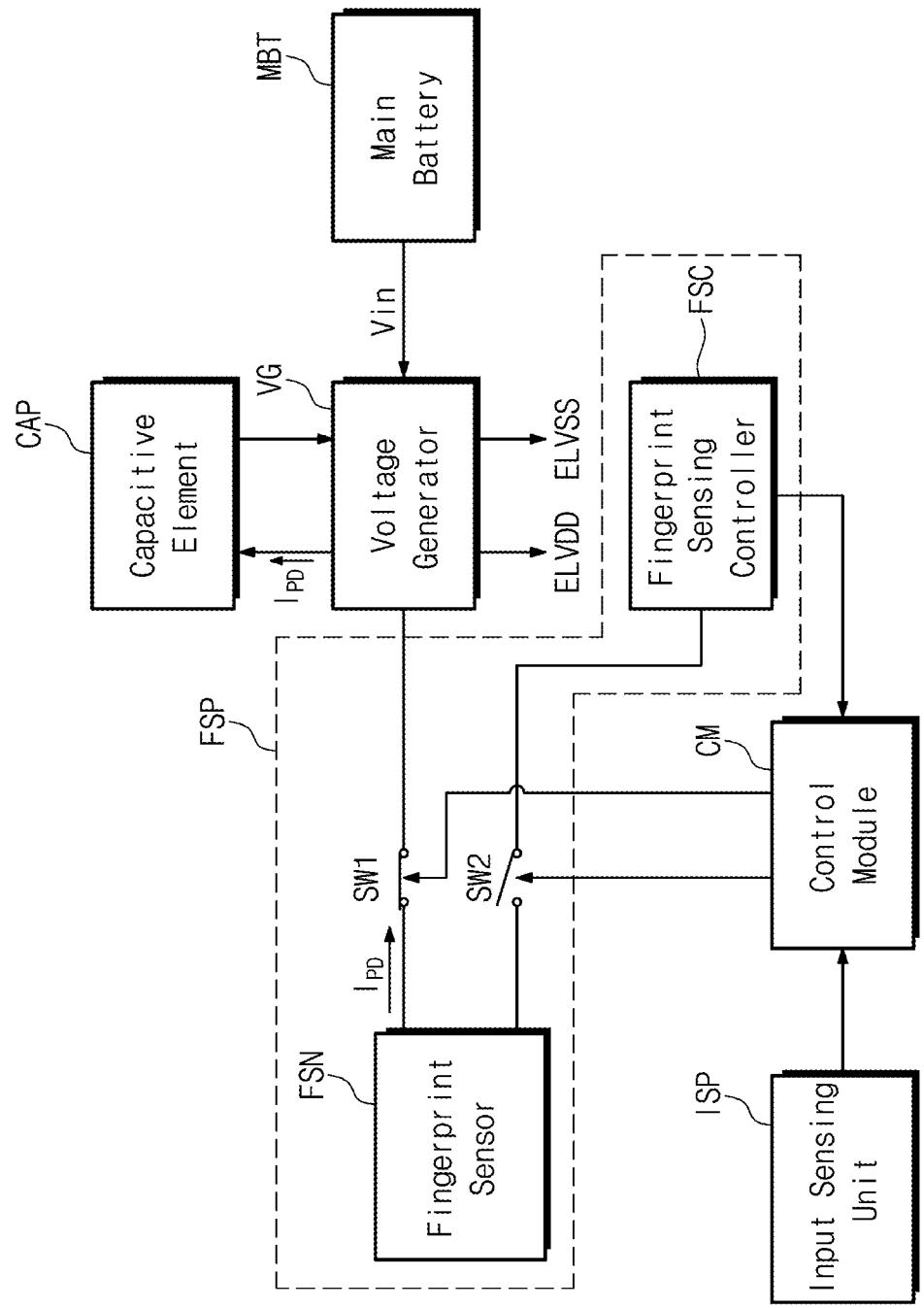
FIG. 14 is a block diagram showing a charging operation of the fingerprint sensor and the capacitive element shown in FIG. 10.

FIG. 13 is a cross-sectional view showing an operation of the fingerprint sensor FSN shown in FIGS. 8 and 10 that receives the external light and the internal light. FIG. 14 is a block diagram showing a charging operation of the fingerprint sensor FSN and the capacitive element CAP shown in FIG. 10.

Referring to FIGS. 13 and 14, when the fingerprint FP (refer to FIG. 11) does not touch the display device DD, i.e., when there are no fingerprint touch information, the control module CM may turn on the first switch SW1 and may turn off the second switch SW2.

For example, the control module CM may turn on the first switch SW1 and may turn off the second switch SW2 before the fingerprint is touched in the initial mode or when the image is displayed in the main mode after the user authentication mode.

When the light L generated by the display panel DP travels in an upward direction, a portion of the light L generated by the display panel DP may be reflected inside the display device DD. For example, the portion of the light L generated by the display panel DP may be reflected by the input sensing unit ISP, reflected by the anti-reflective layer RPL, or reflected by a lower surface of the window WIN, and then, may travel in a rearward direction of the display panel DP. Hereinafter, the reflected light is referred to as the "internal light IL". The internal light IL may be provided to the fingerprint sensor FSN.

The external light OL may be provided to the display device DD from the outside of the display device DD. The external light OL may be provided to the fingerprint sensor FSN after passing through the display panel DP.

The fingerprint sensor FSN may convert the external light OL and the internal light IL to the electrical energy. For example, the photodiode PTD of the photo sensor PS shown in FIG. 9 may convert the external light OL and the internal light IL to the electrical energy. That is, the fingerprint sensor FSN may serve as a solar cell that generates electricity using a light supplied thereto. The electrical energy generated by the fingerprint sensor FSN may be charged in the capacitive element CAP.

In detail, the fingerprint sensor FSN may output the electrical energy as a photocurrent $I_{PD}$. The photocurrent $I_{PD}$ generated by the fingerprint sensor FSN may be provided to the voltage generator VG through the turned-on first switch SW1, however, it should not be limited thereto or thereby. The photocurrent $I_{PD}$ generated by the fingerprint sensor FSN may be provided to the capacitive element CAP through the first switch SW1. The voltage generator VG may provide the photocurrent $I_{PD}$ to the capacitive element CAP. Electric charges corresponding to the photocurrent $I_{PD}$ may be charged in the capacitive element CAP.

The capacitive element CAP may provide the electric charges charged therein to the voltage generator VG. The voltage generator VG may generate the first and second voltages ELVDD and ELVSS using the voltages provided not only from the main battery MBT but also from the capacitive element CAP.

In the exemplary embodiment, when the display device DD does not perform the fingerprint authentication operation, the electrical energy generated by the fingerprint sensor FSN may be stored in the capacitive element CAP and may be provided to the voltage generator VG. Accordingly, the fingerprint sensor FSN may be efficiently used.

Figure 15:
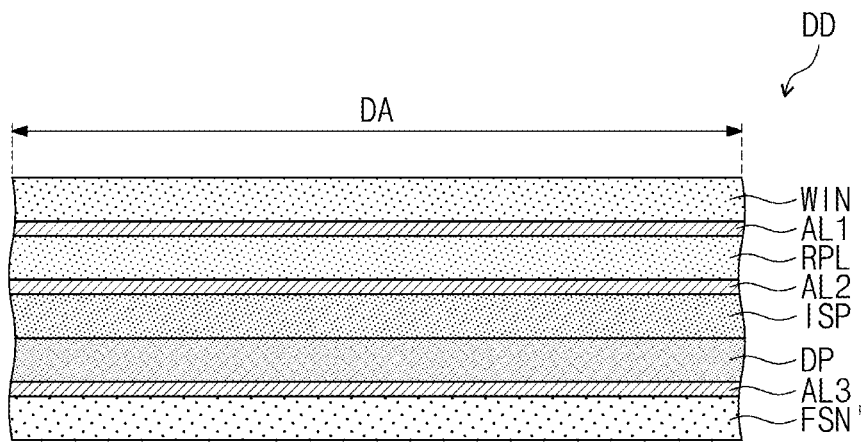
FIG. 15 is a cross-sectional view of another exemplary embodiment of a display device constructed according to the principles of the invention.

FIG. 15 is a cross-sectional view of another exemplary embodiment of a display device DD constructed according to the principles of the invention.

Referring to FIG. 15, a fingerprint sensor FSN' of the display device DD may be expanded. For example, fingerprint sensor FSN' may have a size greater than that of the fingerprint sensor FSN (refer to FIG. 8) described above. The fingerprint sensor FSN' may entirely overlap a display area DA. In this case, the fingerprint sensor FSN' may increase in size to a width of the display device DD. The expanded fingerprint sensor FSN' may include more photo sensors PS, and thus, may convert more light energy provided thereto to electrical energy.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel to display an image by generating light;
   a sensor disposed under the display panel to convert a light energy into an electrical energy;
   a voltage generator connected to the sensor; and
   a capacitive element connected to the sensor, wherein the electrical energy generated by the sensor is charged in the capacitive element,
   wherein the sensor senses an object using the light reflected by the object, and
   wherein the sensor comprises a fingerprint sensor having at least one photo sensor to convert the light energy into the electrical energy, and the object comprises a fingerprint.

2. The display device of claim 1, wherein the capacitive element comprises a capacitor.

3. The display device of claim 2, wherein the capacitor has a capacitance from about several hundred farads (F) to about several thousand farads (F).

4. The display device of claim 1, wherein the fingerprint sensor is connected to the capacitive element via the voltage generator.

5. The display device of claim 4, further comprising a fingerprint sensing controller connected to the fingerprint sensor to receive a fingerprint sensed by the fingerprint sensor when the fingerprint is provided to the display panel, and to output fingerprint information obtained by processing the sensed fingerprint.

6. The display device of claim 5, further comprising:
   a first switch connected to the fingerprint sensor and the voltage generator;
   a second switch connected to the fingerprint sensor and the fingerprint sensing controller; and
   a control module to control the first switch and the second switch.

7. The display device of claim 6, wherein the control module is configured to turn on the first switch and turn off the second switch when the fingerprint is not provided to the display panel.

8. The display device of claim 7, wherein the fingerprint sensor is configured to receive an internal light generated by the display panel and an external light and to convert the external light and the internal light to the electrical energy, and the electrical energy is charged into the capacitive element through the voltage generator.

9. The display device of claim 6, wherein the control module is configured to turn on the second switch and turn off the first switch when the fingerprint is provided to the display panel.

10. The display device of claim 6, further comprising an input sensing unit disposed on the display panel, wherein the input sensing unit is configured to provide touch information of the fingerprint to the control module when the fingerprint is provided to the display panel.

11. The display device of claim 1, wherein the voltage generator is configured to receive the electrical energy from the capacitive element.

12. The display device of claim 1, further comprising an adhesive layer disposed between the display panel and the sensor.

13. The display device of claim 12, wherein a sum of a thickness of the adhesive layer and a thickness of the sensor is equal to or less than about 0.1 mm.

14. A display device comprising:
- a display panel;
- a fingerprint sensor disposed under the display panel;
- a first switch;
- a voltage generator connected to the fingerprint sensor via the first switch;
- a capacitive element connected to the voltage generator;
- a second switch;
- a fingerprint sensing controller connected to the fingerprint sensor via the second switch; and
- a control module to control a switching operation of the first switch and the second switch.

15. The display device of claim 14, wherein the control module is configured to turn on the first switch and turn off the second switch when a fingerprint is not provided to the display panel.

16. The display device of claim 15, wherein a light provided to the fingerprint sensor is converted into an electrical energy by the fingerprint sensor, and the electrical energy is provided to the capacitive element via the turned-on first switch and the voltage generator.

17. The display device of claim 15, wherein the control module is configured to turn on the second switch and turn off the first switch when the fingerprint is provided to the display panel.

18. The display device of claim 17, wherein the fingerprint sensor is configured to sense the fingerprint, and the sensed fingerprint is provided to the fingerprint sensing controller via the turned-on second switch.

* * * * *